United States Patent
Hwang et al.

(10) Patent No.: US 6,608,855 B1
(45) Date of Patent: Aug. 19, 2003

(54) SINGLE-MODE DBR LASER WITH IMPROVED PHASE-SHIFT SECTION

(75) Inventors: Wen-Yen Hwang, Sugar Land, TX (US); Klaus Alexander Anselm, Sugar Land, TX (US); Jun Zheng, Houston, TX (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 0 days.

(21) Appl. No.: 10/159,347

(22) Filed: May 31, 2002

(51) Int. Cl.$^7$ .............................. H01S 3/08; H01S 5/00

(52) U.S. Cl. .............................. 372/96; 372/45; 372/46

(58) Field of Search ................................. 372/96, 45–46

(56) References Cited

U.S. PATENT DOCUMENTS

| | | | | |
|---|---|---|---|---|
| 4,796,273 A | * | 1/1989 | Yamaguchi | 372/96 |
| 4,833,687 A | | 5/1989 | Hirata | |
| 4,847,856 A | | 7/1989 | Sugimura et al. | |
| 5,052,015 A | | 9/1991 | Ackerman et al. | |
| 5,357,538 A | | 10/1994 | Talneau et al. | |
| 5,412,496 A | * | 5/1995 | Nakajima et al. | 359/152 |
| 5,659,562 A | * | 8/1997 | Hisa | 372/96 |
| 5,960,023 A | * | 9/1999 | Takahashi | 372/96 |
| 6,018,534 A | | 1/2000 | Pan et al. | |
| 6,175,581 B1 | | 1/2001 | Sato | |
| 6,330,268 B1 | | 12/2001 | Huang | |

OTHER PUBLICATIONS

Morthier, G. et al., "Laser Diodes with Distributed Optical Feedback," *Handbook of Distributed Feedback Laser Diodes.*, Chapter 1, Section 1.6.4, pp. 23–25.
Morthier, G, et al., "The λ/4 Phasse–Shifted DFB Laser," *Handbook of Distributed Feedback Laser Diodes.*, Chapter 4, Section 4.1.4, pp. 102–104.
Chuang, Shun Lien, "Distributed Feedback Lasers," *Physics of Optoelectronic Devices*, Chapter 10, Section 10.6, pp. 457–464.
Haus, H.A. et al., "Antisymmetric Taper of Distributed Feedback Lasers," *IEEE Journal of Quantum Electronics*, vol. QE–12, No. 9 (1976), pp. 532–539.
Soda, H., et al., "Stability in Single Longitudinal Mode Operation in GaInAsP/InP Phase–Adjusted DFB Lasers", *IEEE Journal of Quantum Electronics*, vol. QE–23, No. 6 (1987) pp. 804–814.
Soda, H., et al., "Design for Single–Mode Asymmetric Quarter–Wavelength–Shifted DFB Laser with High Differential Efficiency," *Electronics Letters*, vol. 23, No. 11 (1987) pp. 598–599.
Usami, M., et al., "Asymmetric λ/4–Shifted InGaAsP/InP DFB Lasers," *IEEE Journal of Quantum Electronics*, vol. QE–23, No. 6 (1987) pp. 815–821.
Kotai, Y., et al., "High–Efficiency Opoeration of Phase–Adjusted DFB Laser by Asymmetric Structure," *Electronics Letters*, vol. 22, No. 9 (1986) pp. 462–463.

* cited by examiner

*Primary Examiner*—Paul Ip
*Assistant Examiner*—James Menepee
(74) *Attorney, Agent, or Firm*—N. Stephan Kinsella

(57) ABSTRACT

An edge-emitting laser for generating single-longitudinal mode laser light at a lasing wavelength. A semiconductor active region amplifies, by stimulated emission, light in the laser cavity at the lasing wavelength. A first grating section adjacent to the active region and having a first reflectance and a first effective index of refraction. A second grating section adjacent to the active region and having a second reflectance and the first effective index of refraction. The first and second grating sections have a Bragg wavelength substantially equal to the lasing wavelength. A gratingless phase-shift section is disposed adjacent to the active region and between the first and second grating sections and has a second index of refraction different than the first index of refraction and a length sufficient to impart a phase shift for light at the lasing wavelength sufficient to achieve single-longitudinal mode operation.

24 Claims, 4 Drawing Sheets

100

100

100

100

100

100

100

100

400

400

400

400

400

SINGLE-MODE DBR LASER WITH IMPROVED PHASE-SHIFT SECTION

BACKGROUND OF THE INVENTION

1. Field of the Invention

This invention relates to distributed Bragg reflector (DBR) lasers and, in particular, to DBR lasers having a quarter-wavelength ($\lambda/4$) phase shift section for improved single-longitudinal mode operation thereof.

2. Description of the Related Art

The following descriptions and examples are not admitted to be prior art by virtue of their inclusion within this section.

There are several types of lasers, including gas lasers, solid-state lasers, liquid (dye) lasers, free electron, and semiconductor lasers. All lasers have a laser cavity defined by at least two laser cavity, mirrors, and an optical gain medium in the laser cavity. The gain medium amplifies electromagnetic waves (light) in the cavity by stimulated emission, thereby providing optical gain.

In semiconductor lasers, a semiconductor active region serves as the gain medium. Semiconductor lasers may be diode (bipolar) lasers or non-diode, unipolar lasers such as quantum cascade (QC) lasers. Semiconductor lasers are used for a variety of industrial and scientific applications and can be built with a variety of structures and semiconductor materials.

The use of semiconductor lasers for forming a source of optical energy is attractive for a number of reasons. Semiconductor lasers have a relatively small volume and consume a small amount of power as compared to conventional laser devices. Further, semiconductor lasers can be fabricated as monolithic devices, which do not require a combination of a resonant cavity with external mirrors and other structures to generate a coherent output laser beam.

The optical gain of a laser is a measure of how well a gain medium such as an active region amplifies photons by.stimulated emission. The primary function of the active region in a semiconductor laser is to provide sufficient laser gain to permit lasing to occur. The active region may employ various materials and structures to provide a suitable collection of atoms or molecules capable of undergoing stimulated emission at a given lasing wavelength, so as to amplify light at this wavelength. The active region may comprise, for example, a superlattice structure, or a single- or multiple quantum well (MQW) structure.

Amplification by stimulated emission in the active region of a semiconductor laser is described as follows. The semiconductor active region contains some electrons at a higher, excited state or energy level, and some at a lower, resting (ground) state or energy level. The number and percentage of excited electrons can be increased by pumping the active region with a pumping energy, from some energy source such as an electrical current or optical pump. Excited electrons spontaneously fall to a lower state, "recombining" with a hole. The recombination may be either radiative or non-radiative. When radiative recombination occurs, a photon is emitted with the same energy as the difference in energy between the hole and electron energy states.

Stimulated emission, as opposed to spontaneous emission, occurs when radiative recombination of an electron-hole pair is stimulated by interaction with a photon. In particular, stimulated emission occurs when a photon with an energy equal to the difference between an electron's energy and a lower energy interacts with the electron. In this case, the photon stimulates the electron to fall into the lower energy state, thereby emitting a second photon. The second photon has, the unique property that it has the, same energy, frequency, and phase as the original photon. Thus, when the photons produced by spontaneous (or stimulated) emission interact with other high energy state electrons, stimulated emission can occur so that two photons with identical characteristics are present. (Viewed as waves, the atom emits a wave having twice the amplitude as that of the original photon interacting with the atom.) I.e., one photon of a given energy, frequency, and phase produces a second photon of the same energy, frequency, and phase; and these two photons may each, if not absorbed, stimulate further photon emissions, some of which can themselves stimulate further emissions, and so on.

Amplification by stimulated emission requires that more photons are produced by stimulated emission than are absorbed by lower-state electrons. This condition, known as population inversion, occurs when there are more excited (upper lasing level) electrons than ground-state (lower lasing level) electrons. If there were more lower state than upper state electrons, then more photons would be absorbed by the lower energy electrons (causing upward excitations) than would be produced by stimulated emission. When there is a population inversion, however, enough electrons are in the excited state so as to prevent absorption by ground-state electrons from sabotaging the amplification process. Thus, when population inversion is achieved, stimulated emission predominates over stimulated absorption, thus producing amplication of light (optical gain). If there is population inversion, lasing is therefore possible, if other necessary conditions are also present.

Population inversion is achieved by applying a sufficient pumping energy to the active region, to raise a sufficient number of electrons to the excited state. Various forms of pumping energy may be utilized to excite electrons in the active region and to achieve population inversion and lasing. For example, semiconductor lasers of various types may be electrically pumped (EP), by a DC or alternating current. Optical pumping (OP) or other pumping methods, such as electron beam pumping, may also be used. EP semiconductor lasers are typically powered by applying an electrical potential difference across the active region, which causes a current to flow therein. As a result of the potential applied, charge carriers (electrons and holes) are injected from opposite directions into an active region. This gives rise to, an increase in spontaneous generation of photons, and also increases the number of excited state electrons so as to achieve population inversion.

In a semiconductor laser, an active region is sandwiched between the cavity mirrors, and pumped with a pumping energy to cause population inversion. Photons are spontaneously emitted in the active region. Some of those photons travel in a direction perpendicular to the reflectors of the laser cavity. As a result of the ensuing reflections, the photons travel through the active region multiple times, being amplified by stimulated emission on each pass through the active region. Thus, photons reflecting in the cavity experience gain when they pass through the active region. However, loss is also experienced in the cavity, for example by extraction of the output laser beam, which can be about 1% of the coherent cavity light, by absorption or scattering caused by less than perfect (100%) reflectance (reflectivity) of the cavity mirrors, and other causes of loss.

Therefore, for lasing to occur, there must be not only gain (amplification by stimulated emission) in the active region, but enough gain to overcome all losses in the laser cavity as well as allow an output beam to be extracted, while still allowing laser action to continue. Gain is a function of wavelength. The minimum gain that will permit lasing, given the cavity losses, for a given wavelength or wavelength range, is the threshold lasing gain of the laser medium for that wavelength or range. A given wavelength is associated with a given threshold gain, and may be characterized by that threshold gain, for a given laser structure. (For EP lasers, the lowest drive current level at which the output of the laser results primarily from stimulated emission rather than spontaneous emission is referred to as the lasing threshold current.)

When the active region provides the threshold lasing gain over a given wavelength range, there will be a sufficient amount of radiative recombinations stimulated by photons, so that the number of photons traveling between the reflectors tends to increase, giving rise to amplification of light and lasing. This causes coherent light to build up in the resonant cavity formed by the two mirrors, a portion of which passes through one of the mirrors (the "exit" mirror) as the output laser beam.

Because a coherent beam makes multiple passes through the optical cavity, an interference-induced longitudinal mode structure or wave is observed. The wave along the laser cavity is a standing EM wave and the cavity of effective optical length L only resonates when the effective optical path difference between the reflected wavefronts is an integral number of whole wavelengths (the effective cavity length or optical path difference takes phase-shifting effects at the mirrors into account). In other words, lasing is only possible at wavelengths for which the round-trip phase is a multiple of $2\pi$. The set of possible wavelengths that satisfy the standing wave condition is termed the set of longitudinal modes of the cavity. Although there are an infinite number of such wavelengths, only a finite number of these fall within the wavelength range over which the gain spectrum of the active region exceeds the threshold lasing gain. The laser will lase only at one or more of the possible longitudinal (wavelength) modes which fit into this wavelength range.

Semiconductor lasers may be edge-emitting lasers or surface-emitting lasers (SELs). Edge-emitting semiconductor lasers output their radiation parallel to the wafer surface, in contrast to SELs, in which the radiation output is perpendicular to the wafer surface, as the name implies. In conventional Fabry-Perot (FP) edge-emitting lasers, a cleaved facet mirror is used to obtain the feedback for laser oscillation. In an FP laser, the two facets of the diode, the rear and the front (emitting) surface, are cleaved to establish the dimensions of the structure such that a primary longitudinal mode of resonance will exist at the desired wavelength.

Other semiconductor lasers, such as distributed-feedback (DFB) and distributed-Bragg reflector (DBR) lasers, employ one or more diffraction gratings to provide reflectance. The diffraction grating, also known as a Bragg grating, contains grating rows, stripes or "teeth" arranged in a regular pitch for distributively feeding light back by Bragg reflection. Such devices provide feedback for lasing as a result of backward Bragg scattering from periodic variations of refractive index, instead of using conventional facets or mirrors to provide reflection.

A DFB laser typically has a uniform diffraction grating constructed in the waveguide itself, adjacent to (i.e., above or below) the active region layer. In such a laser, optical feedback is provided along the laser's cavity length by means of a diffraction grating whose stripes or teeth run perpendicular to the length (longitudinal direction) of the laser cavity. The grating serves as an internal periodic feedback structure that establishes the wavelength of operation.

The term "DBR laser" typically denotes an edge-emitting laser comprising a grating that is not uniform, i.e. a grating that is not continuous over the entire longitudinal cavity. A typical DBR laser has one or two grating sections fabricated in a waveguide external to the active region, which grating sections provide part or all of the reflectance of the cavity mirrors. For example, the DBR laser typically is an edge-emitting laser having two separate DBRs or gratings, each at either end of, and outside, the active region layer. The DBRs reflect and thus provide feedback at the desired wavelength.

Diffraction gratings provide optical feedback by the period variation of the effective refractive index of the grating. The period index variation causes a wavelength-selective feedback. Thus, the diffraction gratings of DFB and DBR lasers, have a reflectance that is a function of wavelength. Maximum reflectance of a diffraction grating occurs around its so-called Bragg wavelength ($\lambda_B$), which is given by Eq. (1) below:

$$\lambda_B = 2\Lambda n_e \quad (1)$$

where $\Lambda$ is the period (pitch) of the grating and $n_e$ is the effective refractive index of the waveguide having the grating. Thus, the Bragg wavelength $\lambda_B$ is determined by the grating pitch or period. The period of DFB and DBR gratings is typically selected so that the Bragg wavelength $\lambda_B$ is equal to the desired operating wavelength of the laser. Diffraction gratings therefore give significant reflection, and thus significant optical feedback, only around the operating wavelength.

Single-wavelength (single longitudinal mode) operation is desirable for many applications, such as in high-bit-rate optical fiber communication. Single-mode operation refers to laser operation in which the intensity of the most-intense, or "primary," mode lasing is substantially greater than all other modes, including the next-most-intense and adjacent modes. Single-mode operation may be said to occur when the side mode suppression is at least a minimum amount (e.g., 30 dB), for example, the primary mode is at least 30 dB greater than its side modes (and all other modes). In telecommunications applications, for example, it is desirable that the laser emit at a single lasing wavelength at 1.31 $\mu$m (and other closely spaced wavelengths), or at telecommunications wavelengths specified by the ITU grid, such as lasing wavelengths of 1.55 $\mu$m (and other closely spaced wavelengths). These wavelength ranges are often used for telecommunications purposes because the loss of silica fibers is comparatively low at these wavelengths.

In a conventional DFB laser, an additional phase shift $\pi$ is introduced at the Bragg wavelength $\lambda_B$. Therefore, the round-trip phase at the Bragg wavelength $\lambda_B$ is $\pi+n2\pi$, where n is an integer. However, $\pi+n2\pi$ is not a multiple of $2\pi$. Thus, the phase condition for oscillation cannot be met at the Bragg wavelength $\lambda_B$ (or corresponding Bragg frequency $f_B$), and no mode occurs at this wavelength. Instead, there are two equally "primary" modes, at two frequencies slightly removed by some frequency f from the Bragg frequency $f_B$, i.e. two optical modes having frequencies $f_B \pm f$ are present. This means that there are two modes having approximately equal threshold gain. These two modes are sometimes referred to as the right Bragg mode and the left Bragg mode.

The presence of these two "co-primary" modes can give rise to an unpredictable lasing frequency, since oscillation often occurs, unpredictably, in either one of the modes, as these two so-called degenerate modes compete substantially equally for lasing as the dominant mode. Mode-hopping can also occur from one mode to the other. The two modes are thus problematic for wideband applications, since a single, narrow linewidth output is needed for wideband applications. Two modes having similar threshold gain are sometimes known as degenerate modes. The existence of two degenerate modes results in multi-mode operation, unpredictable modes, or mode hopping, sometimes referred to as mode degeneracy.

It is preferable to construct a laser in which there is only a single primary mode, i.e. in which there is no mode degeneracy. The insertion of a $\pi/2$ optical phase shift section into the DFB structure is one way to "suppress" or "break" the mode degeneracy, so as to achieve single-mode operation. This phase shift region creates an extra $\pi/2$ phase shift for each wave passing along it of wavelength $\lambda_B$. The $\pi/2$ phase shift section thus provides an extra round-trip phase shift of $\pi$, which adds to the additional phase shift $\pi$ introduced by a conventional DFB laser at the Bragg wavelength $\lambda_B$, so that the round-trip phase is a multiple of $2\pi$ at the Bragg wavelength $\lambda_B$. That is, $\pi+(\pi+n2\pi)=2\pi+n2\pi=(n+1)2\pi$, which is an integer multiple of $2\pi$, since $(n+1)$ is an integer.

Thus, with a $\pi/2$ phase shift section in the grating, the phase condition for oscillation can be met at the Bragg wavelength $\lambda_B$ (or Bragg frequency $f_B$). In effect, the. $\pi/2$ phase shift technique provides for optical phase matching to adjust the main mode at the Bragg wavelength. This "reduces" the number of resonance modes to one, and its resonance frequency coincides with the Bragg frequency $f_B$. Thus, the $\pi/2$ phase shift section effectively provides lasing predominantly on a preferred and fixed Bragg mode. The result is a laser that has only one primary mode, i.e. only one longitudinal mode with the lowest threshold gain at the Bragg wavelength, thereby achieving stable single mode oscillation at the Bragg wavelength. (Conventional DBR lasers typically employ an actively, controlled phase-shift section in which current is injected to control the phase shift.)

The $\pi/2$ phase shift of this technique is also known as a quarter-lambda, quarter-wavelength, or $\lambda/4$ phase shift. This is because introducing a $\pi/2$ phase shift at $\lambda_B$ is equivalent to adding a section of length $\Lambda/2=\lambda_B/(4n_e)$ into the grating structure. Although $\lambda/4$ is literally a length, not a phase shift, the terminology "$\lambda/4$ phase shift" will be employed herein due to the conventional use of this term. It will be understood that a "$\lambda/4$ phase shift", as the term is used in this application, refers to a phase shift of $\pi/2$, at wavelength $\lambda_B$, which phase shift is equivalent to the phase shift that would be obtained if a section of length $\Lambda/2=\lambda_B/(4n_e)$ were to be inserted into the optical path, i.e. the phase shift (at $\lambda_B$) resulting from increasing the optical path by length $\lambda_B/4$.

Various approaches have been employed to shift the optical phase by $\pi/2$ in DFB lasers. For example, to achieve a $\pi/2$ shift, many commercial lasers simply insert lithographically a physical $\lambda/4$ phase shift into the grating mask. The resultant devices are known as $\lambda/4$ or $\pi/2$ phase-shifted DFB lasers and oscillate with a single frequency close to the Bragg frequency of the grating. Such structures employing directly phase-shifted gratings are described in "Stability in Single Longitudinal Mode Operation in GaInAsP/InP Phase-Adjusted DFB Lasers," by Haruhisa Soda et al., *IEEE J. Quantum Electronics*, vol. QE-23, No. 6, June 1987, pp. 804–814 (Haruhisa Soda Reference), "Asymmetric $\lambda/4$-Shifted InGaAsP/InP DFB Lasers," Masashi Usami et al., *IEEE J. Quantum Electronics*, vol. QE-23, No. 6, June 1987, pp. 815–821 (Masashi Usami Reference); *Distributed Feedback Semiconductor Lasers*, by John Carroll, James Whiteway & Dick Plumb (London: Institution of Electrical Engineers, 1998) (Carroll Reference), section 1.7.2 (pp. 26–28); and *Handbook of Distributed Feedback Laser Diodes*, by Geert Morthier & Patrick Vankwikelberge (Boston: Artech House, Inc., 1997), section 4.1.4, pages 102–104 (Morthier & Vankwikelberge Reference).

Other techniques for shifting the optical phase by $\pi/2$ include: employing a nonuniform waveguide structure, as described in the Haruhisa Soda Reference; providing a waveguide having two straight portions and a bending portion, so that the longer bending portion causes a quarter-lambda shift, as described in U.S. Pat. No. 4,833,687; changing the thickness of the active layer in a phase shift section, as described in U.S. Pat. No. 4,847,856; and moving the left and right sections of the grating with respect to each other in a direction perpendicular to the longitudinal axis of the active region, as described in U.S. Pat. No. 5,052,015.

However, there are various disadvantages with conventional $\lambda/4$ phase-shifting techniques. For example, directly inserting a physical $\lambda/4$ phase shift into the grating mask can be difficult to manufacture, because it requires multiple grating fabrication steps, for example. Also, such phase-shift sections inserted directly into the corrugation of the grating does not give optimum dynamic wavelength stability during modulation, requiring more complex phase-adjusting techniques such as insertion of two $\lambda/8$ phase shift sections, which can add to the difficulties of manufacture.

Further details of DFB lasers and diffraction gratings may be found in the Carroll Reference and in the Morthier & Vankwikelberge Reference.

BRIEF DESCRIPTION OF THE DRAWINGS

Other features and advantages of the invention will become apparent upon, study of the following description, taken in conjunction with the attached FIGS. 1–4.

DETAILED DESCRIPTION OF THE INVENTION

The present invention provides a single-mode DBR laser with an improved phase-shift section and a method for fabricating a single-mode DBR laser with improved yield. The present invention comprises an edge-emitting semiconductor DBR laser having two DBR gratings adjacent to opposite ends of the active region layer, and a quarter-wavelength phase shift-section disposed longitudinally between the two DBR grating sections so that it is adjacent to an intermediate portion of the active region layer between its opposing ends. The phase shift section is a section where there is no grating, so that the phase shift section has an effective index of refraction different from that of the two DBR gratings. The length of the grating section and the relative effective indexes of refraction of the phase-shift section and the grating sections are selected to achieve a phase shift approximately equal to π/2, in a preferred embodiment, or enough of a phase shift to suppress mode degeneracy so that there is only one primary mode.

The DBR laser of the present invention may be utilized for various applications such as telecommunications applications. For example, the DBR laser may be designed to emit at 1.31 μm or 1.55 μm wavelengths, where optical fibers have lower attenuation. Further details, advantages, and embodiments of the invention are described below with reference to FIGS. 1–4.

Figure 1:
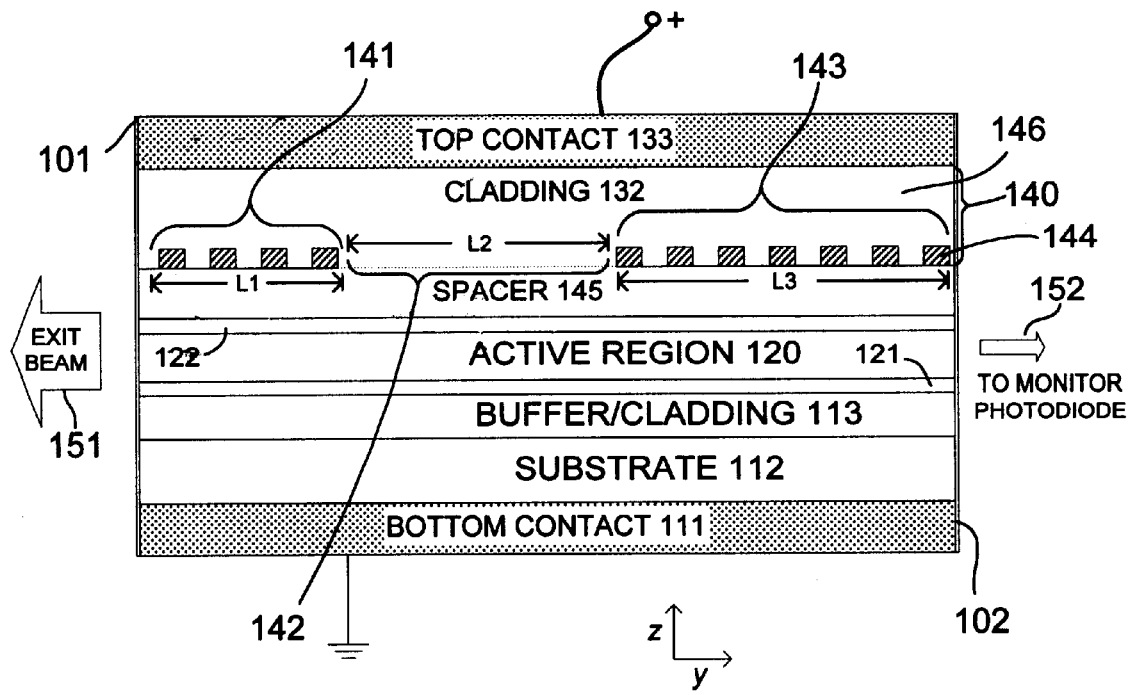
FIG. 1 is a cross-sectional view of the layer structure of a DBR laser having a phase-shift section, in accordance with an embodiment of the present invention.

Referring now to FIG. 1, there is shown a cross-sectional view of the layer structure of a DBR laser 100 having a gratingless (i.e., grating-free) phase-shift section 142, in accordance with an embodiment of the present invention. DBR laser 100 is an edge-emitting laser having bottom contact layer 111, substrate 112, buffer/cladding layer 113, bottom confinement layer 121, active region 120, top confinement layer 122, spacer layer 145, grating layer 140, and top contact layer 133. Laser 100 has anti-reflectance (AR) coatings 101 and 102 on its facets.

Laser 100 comprises layers and structures fabricated on substrate 112 by epitaxial or other deposition techniques. In particular, the epitaxially grown layers of laser structure 100 may be fabricated on a top major surface of wafer substrate 112 with epitaxial growth techniques such as molecular beam epitaxy (MBE), liquid phase epitaxy (LPE), a vapor phase epitaxy (VPE) process such as or metalorganic chemical vapor deposition (MOCVD, also known as MOVPE), or other known crystal growth processes. Other layers and structures that are not epitaxially grown may be deposited with non-epitaxial deposition techniques such as e-beam evaporation, thermal evaporation, or sputtering.

Grating layer 140 has an upper cladding layer 132 (consisting of material 146), first ("exit," or "front") grating section 141, second ("back") grating section 143, and a phase-shift section 142 sandwiched between the first and second gratings 141, 143. Gratings 141, 143 each comprise a plurality of diffraction grating stripes, rows or teeth 144 that run in the x direction, perpendicular to the length (longitudinal direction y) of the laser cavity.

First grating section 141 is approximately of length L1 and comprises a grating having a grating pitch or period selected to have a Bragg wavelength $\lambda_B$ equal to the desired operating wavelength of the laser. Second grating section 143 is approximately of length L3 and also comprises a grating having a grating pitch selected to have the same Bragg wavelength $\lambda_B$. As will be appreciated, gratings 141, 143 comprise a much larger number of grating periods than illustrated in the figures, which are not drawn to scale for simplicity of illustration. For.example, each of grating sections 141, 143 covers hundreds of grating periods in various practical applications and embodiments. Phase-shift section 142 is a grating-free phase-shift section interposed between the first and second gratings, and is of approximately length L2, and also covers a length equal to hundreds of grating periods in typical embodiments. In an embodiment, the gratings of sections 141, 143 are "in phase" with each other, and the gratingless phase-shift section 142 covers an length between the first and second grating sections 141, 143 which is "missing" grating periods that would otherwise be in phase with the grating periods of grating sections 141, 143.

Phase-shift section 142 may be referred to as a "distributed" phase-shift section because it extends over a substantial number of (missing) grating periods, between the first and second grating sections, and is of comparable length to these distributed grating reflectors 141, 143. For example, in preferred embodiments, length L2 is no less than 1/10 the length of the smaller of lengths L1, L3. In various practical embodiments, none of lengths L1, L2, and L3 is more than two or three times the length of the others.

In an embodiment, bottom and top contact layers 111, 133 consist primarily of a metal such as Au. Other materials may be employed in alternative embodiments. Top contact layer 133 may also comprise a thin (e.g., about 250 Å to 500 Å thick) contact-facilitating layer (not shown) between the metal (Au) and cladding 132, comprised of a material such as doped InGaAs (with a doping density of about $5 \times 10^{19}$/cm$^3$), to provide for electrical contact between the cladding 132 and the metal of the metal contact layer portion of contact 133. (e.g. a ground or other electrical terminal or wire bond). Probes or wire bonds may be electrically coupled to top and bottom contacts 111, 133 to provide pumping current to laser 100, so as to give rise to population inversion.

In an embodiment, substrate 112, buffer/cladding layer 113, spacer layer 145, and material 146 of grating layer 140 (including cladding layer 132) consist of InP, which is often. used as a substrate material for 1.55 μm and 1.31 μm devices. In an embodirment, substrate 112 is about 120 μm thick; buffer/cladding layer 113 is about 0.8 μm thick; spacer layer 145 is about 40 nm thick; and cladding layer 132 is about 1.2 μm thick. Other thicknesses are possible in alternative embodiments.

Active region 120, in an embodiment, comprises a structure such as multiple quantum wells (MQWs) which provide a gain spectrum suitable for emitting radiation at the desired wavelength, e.g. 1.31 μm. Active region 120 may consist of a material such as (undoped) InGaAsP/InP (or InAlGaAs/InP) having, for example, seven quantum wells (QWs) (each QW having a QW layer and a corresponding QW barrier layer). In alternative embodiments, active region 120 could have a single quantum well, superlattice, or other structure instead of an MQW structure. In an embodiment, active region 120 is about 0.1 to 0.2 μm thick.

Quaternary compounds or alloys composed of elements from the third group (Al, Ga, In) and the fifth group (P, As, Sb) of the periodic system (sometimes called III–V semiconductor compounds) are often employed in devices using InP substrates because they may be lattice-matched to InP. Confinement layers 121, 122 have an index of refraction selected to be greater than that of the adjacent InP-based buffer/cladding layer 113 and spacer layer 145, so as to confine more of the optical field to the active region 120, which confinement layers 121, 122 surround.

The bandgap of a quaternary material, measured in eV, is typically specified in terms of the wavelength of light at which photons have the same energy as the bandgap. Thus, for example, a material having a bandgap equal to the energy of photons of a wavelength of 1.1 μm may be said to have a bandgap of 1.1 μm. In an embodiment, confinement layers 121, 122 consist of a quaternary material, such as InGaAsP, lattice-matched to InP and having a bandgap of about 1.1 μm, so as to provide an index of refraction of about 3.3, which is greater than the index of refraction of the adjacent InP layers (i.e., 3.2). Confinement layers 121, 122 are about 100 nm thick in an embodiment.

AR coatings 101, 102 consist of a $Ta_2O_5/SiO_2$ mixture and are about 1 μm thick, in an embodiment. Such AR coatings provide, in an embodiment, about 0.1% reflectance.

The diffraction grating stripes 144 consist of a material having an index of refraction $n_1$ which is different from the index of refraction $n_2$ of the surrounding material 146 of cladding layer 132 and spacer layer 145. In an embodiment, $n_1 > n_2$. For example, where material 146 is InP, $n_2 = 3.2$. The grating material from which grating stripes 144 are made may consist of quaternary material lattice-matched to InP, such as InGaAsP, and having a bandgap selected to provide a desired (e.g., optimal) index of refraction $n_1$. For example, the relative mole concentrations for the: InGaAsP compound may be selected to achieve a bandgap of about 1.18 1.1 µm, so that $n_1 = 3.4$.

Depending on the,cross-section, size; pitch, and duty cycle of grating sections 141, 143, and the values of $n_1$ and $n_2$, as well as the indexes of refraction of other layers "seen" by light in the cavity, grating sections 141, 143 will have an effective index of refraction $n_G$ (where "G" stands for "grating"). In an embodiment, with values of $n_1$ and $n_2$ as given above, and other details for the material and thicknesses of other layers of laser 100, $n_G$ is about 3.2333. Similarly, the effective index of refraction of phase-shift section 142, $n_{PS}$, is about 3.23 (where "PS" stands for "phase-shift"). Index $n_G$ is close to, but slightly greater than, $n_{PS}$.

The presence of higher index of refraction grating stripes 144 within grating sections 141, 143 (i.e., $n_1 > n_2$) makes the effective index of refraction $n_G$ of grating sections 141, 143 slightly greater than that of phase-shift section 142, which does not contain these higher-index stripes. That is, the presence of a grating section having alternating index of refraction sections ensures that $n_G$ will be different than $n_{PS}$, which does not have a grating. Thus, by virtue of phase-shift section 142 being gratingless, it has an index of refraction $n_{PS}$ necessarily different than the index of refraction $n_G$ of an adjacent grating section. However, in practical embodiments, such as InP-based devices for applications such as 1.31 82 m or 1.55 µm emission, $n_G$, although slightly greater than $n_{PS}$, will be very close to $n_{PS}$. This is because index $n_1$ of grating stripes 144 is 3.4, close to 3.2, the index of refraction $n_2$ of the surrounding material 146 of cladding layer 132. Thus, by adding a comparatively small amount of material of index 3.4 into material of index 3.2, the effective index changes, but only by a small amount, i.e. from about 3.23 to about 3.2333 in the illustrated embodiments.

The lengths L1, L3 of grating sections 141, 143, in an embodiment, are different (L1<L3), to provide an asymmetric reflectance. This causes more laser light to be output through the lower reflectance mirror 141, so that the laser puts out two laser beams: a primary, exit beam 151 (exiting through the side with shorter, lower-reflectance grating section 141 and AR coating 101) and a weaker beam 152 (exiting through the side having higher-reflectance, longer grating section 153 and AR coating 102). The stronger, primary beam 151 may be coupled to some external light-receiving device such as a lens, fiber, amplifier, modulator, and so on. The weaker beam 152 may be directed onto a monitor photodiode (not shown) for power monitoring or other purposes.

Typically, a given power ratio (the ratio of the power of the primary output beam 151 to the power of the secondary beam 152), such as 4:1 or some other ratio, may be desired. The greater the back-to-front reflectance ratio of the cavity mirrors, the greater the power ratio, although the relationship is not linear. Similarly, the reflectance of a grating section increases with length, but not in a linear fashion. Therefore, the back-to-front reflectance ratio is a non-linear function of the back-to-front grating section lengths L3, L1 and their ratio L3:L1. Thus, for a given grating and waveguide structure, grating section lengths L1 and L3 are selected, as described below, to achieve a desired reflectance ratio (e.g., about 2:1 or 3:1), so that output beam 151 is stronger than secondary beam 152 by a desired power ratio (e.g., anywhere from 2:1 to 10:1). The length L2 of phase-shift section 142 is determined as described below, in order to achieve the appropriate phase shift.

In an embodiment, the pitch of grating sections 141, 143 is selected to provide a $\lambda_B$ equal to the operating wavelength, e.g. 1.31 µm. For example, a grating having a period length (pitch) $\Lambda$ is selected in accordance with Eq. (1) above, repeated here for convenience:

$$\lambda_B = 2\Lambda n_e \qquad (1)$$

Index $n_e$ is approximately equal to $n_G$, which is about 3.2333. To achieve $\lambda_B = 1.31$ µm, where $n_e$ 3.2333, use of Eq. (1) results in $\Lambda \approx 202.6$ nm. For a 50/50 duty cycle, each stripe is approximately 101 nm wide. Each stripe is typically 1 to 5 times as high as it is wide. Thus, 100 nm wide stripes may be about 100 to 500 nm in height. In an embodiment, stripes 144 are. substantially rectangular, having a width of about 100 nm and a height of about 150 nm. The "corners" of the grating profile may be somewhat rounded, in some applications, e.g. due to fabrication phenomenon such as mass transport.

The effective optical path length $\Phi$ introduced in the optical cavity by the phase-shift section 142 of length L2 is specified in Eq. (2) below:

$$\Phi = L2 \cdot ABS(n_G\ n_{PS}) \qquad (2)$$

In order to achieve the desired phase shift $\pi/2$ (i.e., $\lambda_B/4$) at $\lambda_B$, $\Phi$ is set at $\lambda_B/4$ and Eq. (2) solved for L2 to yield:

$$L2 = (\lambda_B/4)/ABS(n_G\ n_{PS}) \qquad (3)$$

Where Eq. (3)is true, phase-shift section 142 introduces an effective optical path length of $\lambda_B/4$, which causes a phase shift of $\pi/2$ for light at $\lambda_B$. For $n_G = 3.2333$, $n_{PS} = 3.23$, and $\lambda_B = 1.31$ µm, L2 must be about 99.2 µm 100 µm to provide a phase shift of $\pi/2$ at $\lambda_B$. Accordingly, in an embodiment, phase-shift section 142 has a length L2 of about 100 µm. This section contains no grating but covers a length equal to about 500 grating periods of length 202.6 nm.

First and second DBR gratings 141, 143 serve as the mirrors for the laser cavity and must have sufficient reflectance for lasing to occur, and preferably have a desired asymmetric reflectance ratio, e.g. about 2.5:1. The reflectance of a given grating section at $\lambda_B$ is a function of its length and its grating coupling factor κ. For a grating of length L, κL is a key dimensionless parameter determining the frequency selectivity and performance of a grating, with practical values of κL typically being around 2 to 3. The grating coupling factor κ is a function primarily of factors such as the n, the duty cycle, grating profile (i.e. stripe shape), height (thickness) of grating, distance from active region 120, degree of optical confinement in the confinement layers 121, 122, and other factors.

The lengths and other properties of gratings 141, 143 are selected so as to achieve a desired back-to-front reflectance ratio, so that output beam 151 is stronger than secondary beam 152, while secondary beam 152 is a known fraction of primary output beam 151 so as to be used in monitoring or other purposes. For example, it may be desired to achieve sufficient grating reflectances and a back-to-front reflectance ratio of about 2.5:1, and a front-to-back power ratio of about 4:1. In an embodiment, κL=3, L1=65 μm, and L3=135 μm. Thus, in this embodiment, DBR laser 100 has a total cavity length L L1+L2+L3 65+100+135 μm 300 μm. First or exit grating 141, of length L1 65 μm, contains about 320 grating periods (and thus about 320 grating stripes 144); similarly, second or back grating section 143, of length L3=135 μm, contains about 670 grating periods. As noted above, phase-shift section contains no grating but covers a length L2 (100 μm) equal to about 500 grating periods.

As can be seen, lengths L1 and L3, though different (in an asymmetric embodiment), will still include hundreds of grating periods in order to achieve the desired reflectance, and will be within the same order of magnitude. Lengths L1, L3 must include hundreds of grating periods because grating sections 141, 143 are "distributed" reflectors that necessarily require many grating periods in order to achieve the desired reflectance necessary for lasing. For example, L1=65 μm (320 periods) is only about twice as large as L3=135 μm (670 periods). As will be appreciated, overall cavity reflectivity is lower when the cavity mirrors 141, 143 have asymmetric reflectance, thus increasing the threshold lasing current. Accordingly, in an embodiment, the grating coupling factor κ may be increased so as to increase cavity reflectance, to control for the loss in cavity reflectance caused by the asymmetric reflectance.

Length L2, about 100 μm in an embodiment (length of about 500 periods), is also of the same order of magnitude as lengths L I, L3. Length L2 also has to cover a length equal to many grating periods (e.g., hundreds), because, as noted above, with stripes of index 3.4 present in cladding of index 3.2 in the grating sections, the effective index $n_G$ is only slightly greater than $n_{PS}$ (3.2333 is very close to 3.23). Therefore, in accordance with Eq. (3) above, where ($n_G$ $n_{PS}$) is small, a comparatively large length L2, equal to hundreds of grating periods in length, is needed to achieve the desired λ/4 phase shift. Thus, grating sections 141, 143, which each include hundreds of grating periods to give rise to the desired reflectance, are distributed reflectors. Analogously, phase-shift section 142 may be referred to as a "distributed" phase-shift section because it extends over a substantial number of (missing) grating periods, between the first and second grating sections, and is of comparable length to these distributed grating reflectors 141, 143. In various practical embodiments, none of lengths L1, L2, and L3 is more than about three times the length of the others.

Simulations were performed by the inventors for a structure similar to that of DBR laser 100 of FIG. 1, assuming: $n_G$=3.2333, $n_{PS}$=3.23, $\lambda_B$=1.31 μm, L1=65 μm, L2=100 μm, and L3=135 μm, κL=3, 0.1% reflectance for AR coatings 101, 102. Simulation of the reflectance versus wavelength of front and back DBR gratings 141, 143 indicates a peak reflectance for each reflector at approximately $\lambda_B$=1.31 μm. In particular, front grating 141 has a peak reflectance of about 0.32, and back grating 143 has a peak reflectance of about 0.77, at 1.31 μm, i.e. a back-to-front reflectance ratio of about 2.4:1. These reflectances are sufficient to permit lasing to occur in an edge-emitting laser structure such as laser structure 100, and also give rise to an asymmetric power output of about 4.2:1, as shown in Table 1, below, which sets forth other simulation results. It is noted that the back-to-front length ratio L3:L1 is about 2:1, and is related to, but not the identical to, the back-to-front reflectance ratio, because reflectance of a DBR grating is not a linear function of its length. Additionally, the front-to-back output power ratio 4.2:1 is related to the back-to-front reflectance ratio 2.4:1 but is not identical to it.

TABLE 1

| Wavelength (μm) | factor k | back-to-front optical power ratio |
| --- | --- | --- |
| 1.3053682 | $1.73^3$ | 0.73 |
| 1.3061604 | $1.69^3$ | 0.80 |
| 1.3069482 | $1.32^3$ | 0.85 |
| 1.3079042 | $1.02^3$ | 2.32 |
| 1.3087273 | $5.88^4$ | 0.87 |
| 1.3101151 | $4.11^4$ | 0.24 |
| 1.3115103 | $5.71^4$ | 0.85 |
| 1.3123437 | $9.89^4$ | 2.32 |
| 1.3133057 | $1.26^3$ | 0.85 |
| 1.3141114 | $1.60^3$ | 0.83 |
| 1.3149188 | $1.65^3$ | 0.73 |

Referring now to Table 1, above, column 1 indicates the cavity mode wavelength, where the sixth entry (in bold) is the desired operating wavelength 1.31 μm. Column 2 indicates the imaginary refractive index factor k (the imaginary component of the effective refractive index of the cavity) at various cavity mode wavelengths. The imaginary refractive index factor k appears in the equation for threshold gain g, which is a function of wavelength and is given by:

$$g = k4\pi/\lambda \qquad (4)$$

As will be appreciated, a lower threshold gain g is desired, all things being equal, and is preferably at a minimum at the operating (Bragg) wavelength $\lambda_B$. A lower magnitude of k results in a lower threshold gain g, and therefore it is desirable for k to have a minimum magnitude at the operating wavelength $\lambda_B$ Column 3 indicates the front-to-back power ratio (that is, the ratio of the power of main exit beam 151 to secondary beam 152) provided by the structure of laser 100 at various cavity mode wavelengths.

As can be seen from the simulation results presented in Table 1, at the desired operating wavelength 1.31 μm=$\lambda_B$, grating sections 141, 143 provide a back-to-front reflectance ratio sufficient to provide front-to-back output power ratio of about 4.2:1 (i.e., the inverse of 0.24). Also, it can be seen that the absolute value of the imaginary refractive index factor k and thus threshold gain g is approximately at a minimum at the desired operating wavelength 1.31 μm.

During operation, a current is applied via probes, wire bonds or other terminals electrically connected to metal contacts 133, 111, which pumps the active region 120 to cause population inversion and begin the lasing process. Light emitted by spontaneous and stimulated emission reflects back and forth in the longitudinal (y axis) direction in the cavity, along the active region 120, reflected back and forth by DBR grating sections 141, 142. The light is amplified in the active region, but the transverse optical cavity extends below and above the active region in the z direction, i.e. into the confinement layers 121, 122, and also into buffer/cladding layer 113, spacer layer 145, and grating layer 140, where Bragg reflection and feedback occurs. Therefore, the light "sees," in each section 141, 142, 143, an effective index of refraction, which is due to the combination of the indexes of refraction of the material of active region 120, as well as material of other layers within the cavity.

As described above, the effective index of refraction $n_G$ of grating sections 141, 143 is slightly greater than the effective index of refraction $n_{PS}$ of phase-shift section 142. Given the difference between $n_{PS}$ to $n_G$, phase-shift section 142 has a length L2 such that light traveling through phase-shift section 142 experiences a phase-shift of λ/2 at the cavity mode and operating wavelength $\lambda_B$=1.31 μm. This phase shift breaks the mode degeneracy that would otherwise occur and causes there to be only a single mode with the lowest threshold gain, i.e. the primary mode, at the Bragg wavelength λB. In other words, without the presence of distributed phase shift section 142, the use of grating sections 141, 143 would result in mode degeneracy in which there are two resonance modes having lowest, approximately equal threshold gains. The phase shift section, in effect, "shifts" both of these modes, one (the primary mode) toward $\lambda_B$ (thus decreasing its threshold gain) and the other, secondary mode, away from $\lambda_B$ (thus increasing its threshold gain). Because the secondary mode has its threshold gain increased relative to that of the primary mode, the secondary mode and mode degeneracy may be said to have been "suppressed" by the phase shift. There remains only a single, primary mode, at about $\lambda_B$, having the lowest threshold gain.

Thus, use of phase-shift section 142 makes single-longitudinal mode operation possible, at $\lambda_B$. Laser 100 emits a main exit laser beam 151 of wavelength $\lambda_B$ through the facet having AR coating 101 and a back beam 152 of smaller intensity from its back side, through AR coating 102. In single-mode operation, the side-mode suppression is at least a minimum amount, e.g. the primary mode is at least a certain amount (e.g., 30 dB) greater than any other modes.

Figure 2:
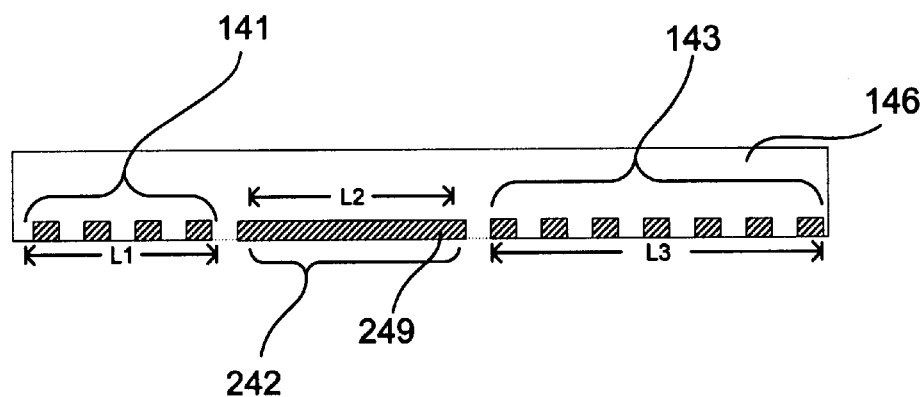
FIG. 2 is a cross-sectional view of an alternative phase-shift section and grating layer, in accordance with an embodiment of the present invention.

Referring now to FIG. 2, there is shown a cross-sectional view of an alternative phase-shift section 242 and grating layer 240, in accordance with an embodiment of the present invention. Grating layer 240 is similar to grating layer 140 of FIG. 1 except that it contains phase-shift section 242, instead of phase-shift section 142.

As described above, phase-shift section 142 is a section that does not contain a grating. Therefore, it has a different index of refraction than the two adjacent grating sections 141, 143, and has the proper length L2 so as to introduce the desired phase shift. Phase-shift section 242 also does not contain a grating. Phase-shift section 142 has no grating by virtue of having no grating stripes 144 or grating material (e.g. InGaAsP) of which the grating stripes are composed. Alternative phase-shift section 242, by contrast, contains grating stripe material section 249 but does not contain stripes, since the material of grating material section 249 does not contain intervening half-periods of material 146, i.e. it is not a grating, it is a gratingless slab of material equal in length (L2) to a large number of grating periods.

Therefore, like phase-shift section 142, phase-shift section 242 also has a different index of refraction than the adjacent grating sections 141, 143. However, unlike phase-shift section 142, the effective index of refraction of phase-shift section 242 is slightly greater than that of grating sections 141, 143, because it contains on average a greater degree of the higher-index grating stripe InGaAsP material (i.e., index 3.4) than the lower-index InP material 146 (i.e., index 3.2). Accordingly, the length L2 of alternative phase-shift section 242 is selected in accordance with Eq. (3) above to achieve a quarter-wavelength phase shift.

As described in further detail below with reference to FIG. 3, a phase-shift section 142 having no grating stripes may be formed by removing, from a continuous grating, the grating stripe material where the phase-shift section is to be formed. As described in further detail below with reference to FIG. 4, a phase-shift section 242 having a grating stripe material section but with no grating or stripes may be formed by refraining from imparting a grating structure on a grating stripe material layer, over the region where the phase-shift section is to be formed, when forming the adjacent grating sections 141, 143.

Figure 3A:
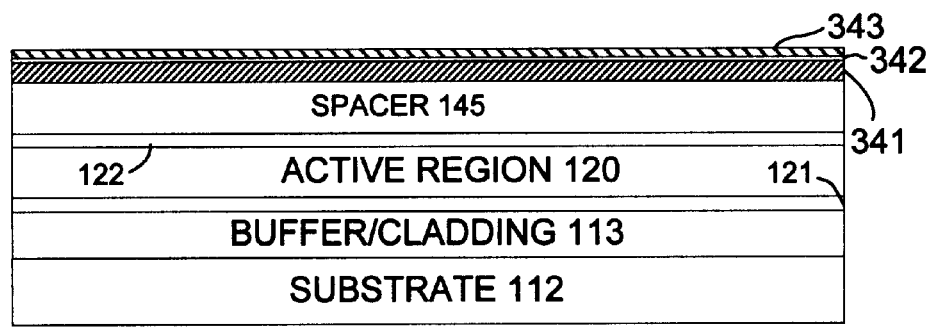
FIGS. 3A–H are cross-sectional views of the layer structure of the DBR laser of FIG. 1 at various stages of fabrication, in accordance with an embodiment of the present invention.

Referring now to FIGS. 3A–H, there are shown cross-sectional views of the layer structure of the DBR laser 100 of FIG. 1 at various stages of fabrication. These views illustrate a method of fabricating DBR laser 100, in accordance with an embodiment of the present invention. First, as shown in FIG. 3A, an initial set of layers are epitaxially grown, e.g. by MBE, onto substrate 112. These include buffer/cladding layer 113, bottom confinement layer 121, active region 120, top confinement layer 122, spacer layer 145, a grating stripe material layer 341, and a thin protective layer 342. After the epitaxial growth of layers 113, 121, 120, 122, 145, 341, and 342 (in sequence), the sample is removed from the MBE chamber for processing steps including depositing a layer of photoresist (PR) 343 on the protective layer 342. PR layer 343 may be thin, about 50 to 100 nm in an embodiment, which is spun onto the wafer surface.

Grating stripe material layer 341 is the material out of which stripes 144 are to be formed, e.g a quaternary material such as InGaAsP. When the sample is removed from the MBE chamber vacuum for deposition of PR layer 343, and during subsequent processing steps, oxide tends to form on the exposed epitaxial layers. Protective layer 342 consists of InP and is used, in an embodiment, because the oxide is easier to remove from InP than from InGaAsP. In alternative embodiments, protective layer 342 is omitted.

Figure 3B:
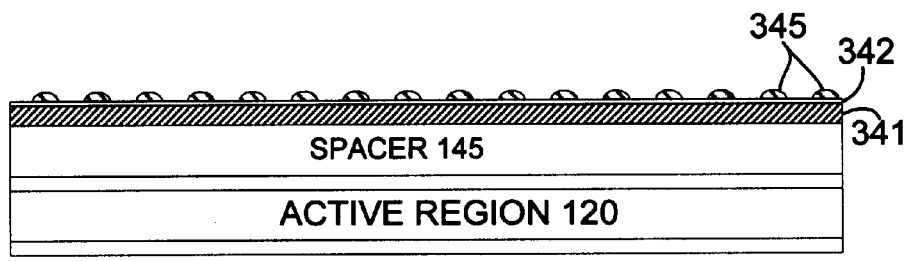

Next, as seen in FIG. 3B, the PR layer 343 is patterned to form a regular series of PR stripes which serve as a grating etch mask 345. The grating etch mask 345 is formed by any suitable technique. In an embodiment, the grating etch mask is formed by lithographically defining the grating in the PR layer 343, by exposing the PR layer to two collimated, expanded beams from a blue or UV laser at an appropriate angle to form high contrast fringes with the desired period. PR layer 343 is then developed and the developed portions removed with an appropriate solvent with grating etch mask 345 remaining. Other techniques for writing a grating into the PR include using electron-beam (E-beam) lithography, a technique which uses special electron-sensitive resists.

Figure 3C:
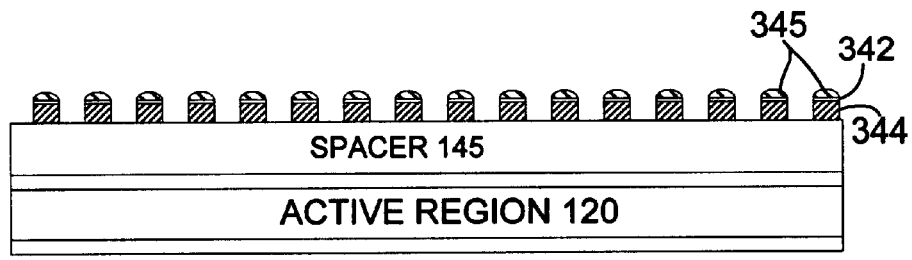
Figure 3D:
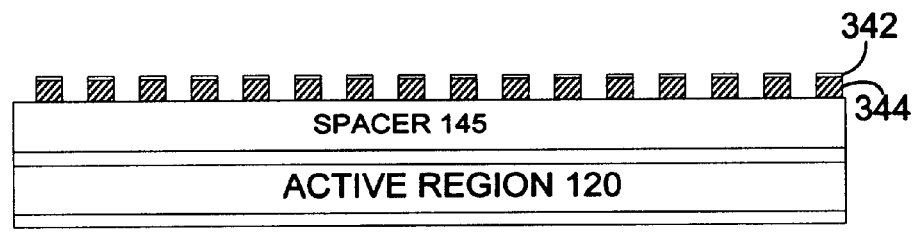

After patterning PR layer 343 to form grating etch mask 345, the underlying protective layer 342 and grating stripe material layer 341 are etched, forming a regular series of grating material stripes 344, as shown in FIG. 3C. At this point in fabrication, each stripe 344 is covered by a respective stripe from grating etch mask 345 composed of PR, PR stripes 345 may be removed with any suitable technique to result in the structure illustrated in FIG. 3D. For example a suitable solvent, oxygen plasma, or other techniques can be used to remove the PR etch mask 345.

Figure 3E:
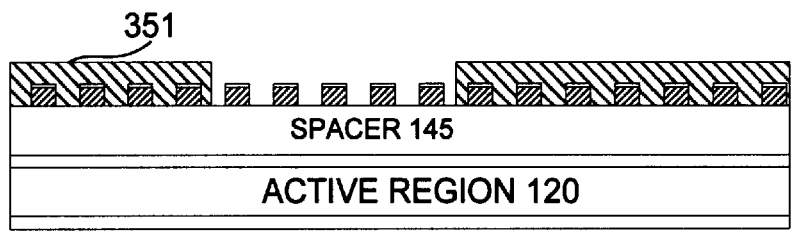
Figure 3F:

Next, as shown in FIG. 3E, a PR mask 351 is formed, which covers and protects the grating stripes which are to form grating sections 141, 143, but which leaves exposed the grating stripes that are to be removed because they occur in the region where phase-shift section 142 is to be formed. After formation of mask 351, an etch is performed to remove the quaternary material of the exposed grating stripes, resulting in the structure shown in FIG. 3F. As can be seen, at this point during fabrication, the sample has two grating sections, separated by an intermediate, gratingless section. Because the two grating sections are formed from an initial, continuous grating, the gratings of the two sections are in phase with each other.

Figure 3G:
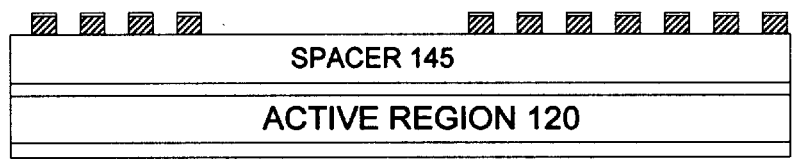
Figure 3H:
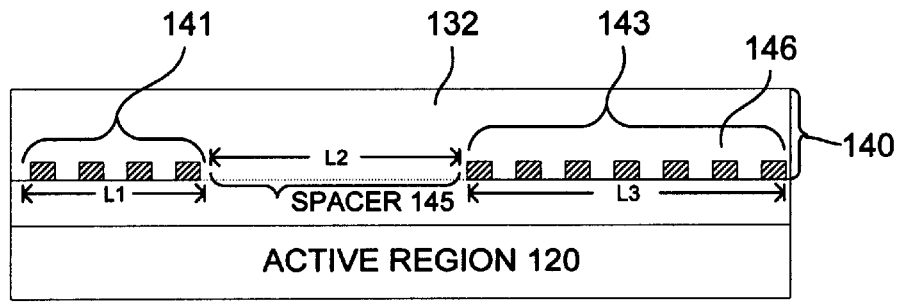

Next, PR mask 351 is removed, e.g with solvent or oxygen plasma, to result in the sample shown in FIG. 3G. Any oxide may then be removed from the sample by appropriate removal or cleaning, and then additional InP 146 is epitaxially grown to complete grating section 140 and cladding layer 132, as illustrated in FIG. 3H. After the processing illustrated in step 3H, bottom contact 111 may be deposited onto the bottom of substrate 112, and top contact 133 may be formed on cladding layer 132, including a thin contact-facilitating layer between the metal (Au) of layer 133 and cladding layer 132, to form the laser structure 100 shown in FIG. 1.

Referring now to FIGS. 4A–E, there are shown cross-sectional views of the layer structure of a DBR laser employing the alternative phase-shift section of FIG. 2 at various stages of fabrication. These views illustrate a method of fabricating a DBR laser 400, such as a modified DBR laser similar to laser 100 except for the different phase-shift section, in accordance with an embodiment of the present invention.

Figure 4A:
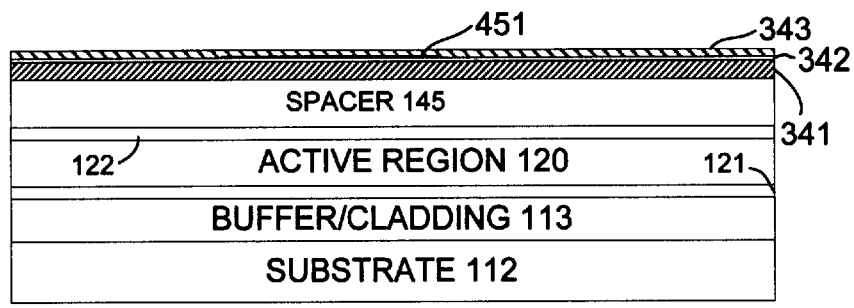
FIGS. 4A–E are cross-sectional views of the layer structure of a DBR laser employing the alternative phase-shift section of FIG. 2 at various stages of fabrication, in accordance with an embodiment of the present invention.

FIG. 4A illustrates a stage in fabrication similar to that described above with reference to FIG. 3A, except that the sample of laser 400, at this point in fabrication, contains a thin barrier layer 451 between PR layer 343 and protective layer 342. This layer extends over the section which is to contain the phase-shift section 242, and its purpose is to provide a barrier to prevent the etching of grating stripes in this region. Barrier layer 451 consists of a material such as $SiO_2$, in an embodiment, although other suitable materials, such as or SiO, may also be employed in alternative embodiments.

Figure 4B:
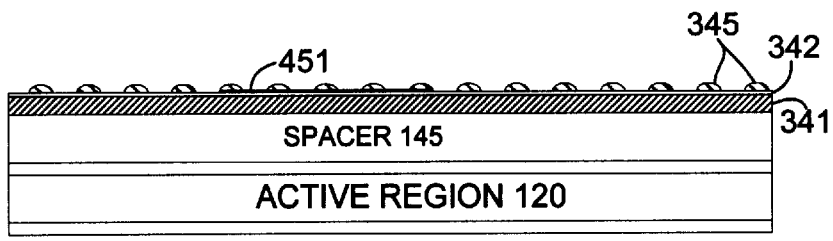
Figure 4C:
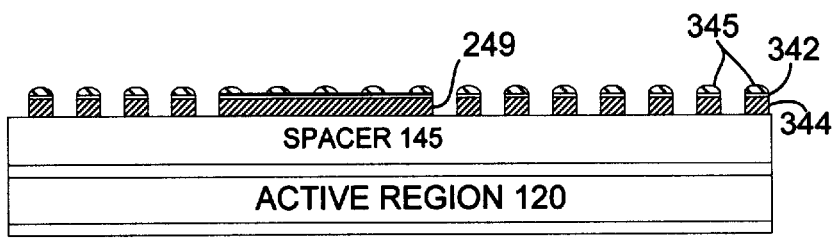

As illustrated in FIG. 4B, a grating etch mask 345 is formed in PR layer 343, as described above with reference to FIG. 3B. However, an intermediate portion of grating etch mask 345 covers barrier layer 451, i.e. over the portion to contain phase-shift section 242. Next, a selective etch is performed which is sufficient to etch away the exposed InP protective layer 342 and grating stripe material 341, but which does not etch the $SiO_2$ barrier layer 451. Thus, the resulting structure illustrated in FIG. 4C contains grating stripes in the regions where grating sections 141, 143 are to be formed, and a grating stripe material section 249 (having no grating or stripes) where gratingless phase-shift section 242 is to be formed.

Figure 4D:
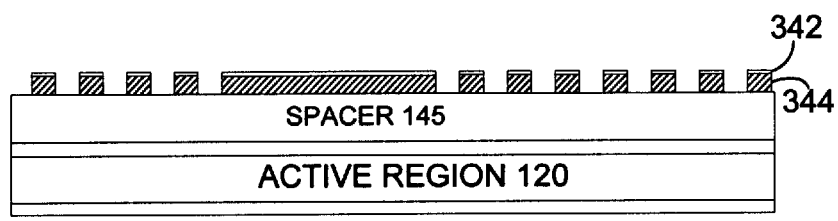
Figure 4E:
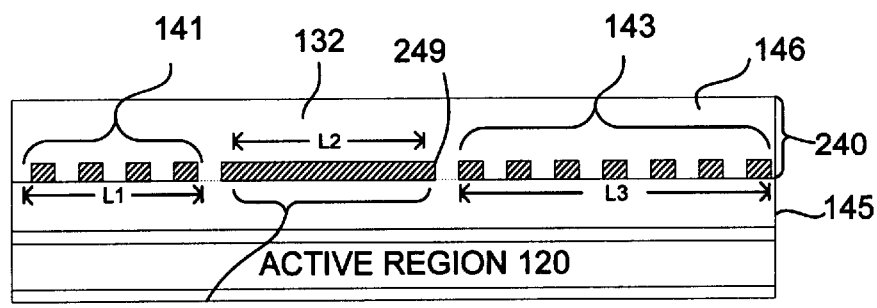

Next, the PR stripes of PR mask 345 covering gratings 344 of grating sections 141, 143 and grating material section 249 is removed, as described above with respect to FIGS. 3C–3D, to result in the structure illustrated in FIG. 4D. Any oxide may then be removed from the sample by appropriate removal or cleaning, and then additional InP 146 is epitaxially grown to complete grating section 240 and cladding layer 132, as illustrated in FIG. 4E. After the processing illustrated in step 4E, as described above with reference to FIG. 3H, bottom contact 111 may be deposited onto the bottom of substrate 112, and top contact 133 may be formed on cladding layer 132, including a thin contact-facilitating layer between the metal (Au) of layer 133 and cladding layer 132, to form the laser structure 100 shown in FIG. 1.

In conventional DBR lasers, HR (high reflectance) coatings are often employed, instead of AR coatings, on at least one of the laser facets, to provide additional reflectivity for the cavity mirror. One problem with the use of HR coatings is that the exact place of the cleave is unpredictable. Therefore, the reflectance provided by the HR coating occurs at an unpredictable place within the grating period, and therefore introduces a somewhat unpredictable, random phase shift into each laser. This can reduce yield, as only a small percentage of the cleaves occur at the proper location in the grating period so as to achieve the desired mode at wavelength $\lambda_B$. The DBR laser 100 of the present invention does not suffer this problem, because only AR coatings are employed, and the cavity mirrors' reflectance is supplied entirely by distributed grating sections 141, 143. The facet cleave location within a particular grating period plays almost no role in the phase shift introduced by the grating, since the grating covers hundreds of grating periods. Therefore, use of a grating-only (no HR coating) DBR laser 100 can be produced with more uniformity of performance (e.g., the operating wavelength, the front-to-back power ratio, etc.) and greater yield.

Moreover, use of a grating-free phase-shift section 142, which achieves a quarter-wavelength phase shift, can also increase uniformity and thus yield. This is because the gratingless phase-shift section is distributed, i.e. spread out over the length of many (e.g. 500) grating periods. Therefore, slight imprecision in the exact, length L2 from device to device causes almost no change in the phase shift effect. This is in contrast to gratings having a quarter-wavelength shift inserted directly into the grating, in which a very small variation in this phase-shift section can have a much more significant effect on the amount of phase shift. Further, fabrication of a directs phase shift section in a grating requires the fabrication of two or more out-of-phase gratings, which complicates the fabrication process. In contrast, the phase-shift section of the present invention may be fabricated (as described above with reference to FIGS. 3 and 4) from a single, continuous grating by removing part of the grating during fabrication.

Another advantage of employing the phase-shift section 142 of the present invention is the achievement of more uniform optical intensity along the longitudinal (y axis) cavity, which also improves linearity; that is, the range over which a linear increase in output power can be attained is extended. A laser having a directly-inserted quarter-wavelength shift section may lead to an optical intensity "spike" or peak at a given location in the longitudinal cavity, corresponding to the location of the quarter-wavelength section. This optical intensity spike or peak limits the output power that can be achieved without causing spatial hole burning, and thus limits the linearity of the device. However, because the phase-shift section of the present invention is spread out over hundreds of periods and may be, of comparable length to the two DBR grating sections, there is no comparable optical intensity "spike" at a single location. This advantageously gives rise to a more uniform distribution of optical power over the longitudinal cavity than is achieved by a directly-inserted phase-shift section which essentially exists at a single longitudinal location in the cavity.

In addition, the distributed phase-shift section of the present invention is not expected to interfere with dynamic wavelength stability during modulation to the degree that a directly-inserted physical $\lambda/4$ phase shift section does, since it is distributed over a wide length equal to many grating periods, instead of occurring at a sharp location point.

As noted above, in an embodiment stripes 144 are substantially rectangular in cross-section, i.e. the grating profile (the boundary z between the high and low refractive index materials "seen" by light traveling in the cavity in the longitudinal, y-axis direction) is a substantially rectangular periodic wave. In alternative embodiments, other shapes than rectangular may be employed for the grating profile, such as square, trapezoidal, triangular/sawtooth, or sinusoidal, and duty cycles other than 50/50 may be employed.

In an alternative embodiment, the diffraction grating stripes 144 consist of a material having an index of refraction n, which is less than the index of refraction $n_2$ of the surrounding material 146 of cladding layer 132 and spacer layer 145.

As described above, in a preferred embodiment L1 L3, so that the light output is not symmetric. In an alternative embodiment, a symmetric design may be employed, in which L1=L3, and the reflectances of the first and second grating sections are identical, so that the output beams 151, 152 have about the same power.

In an alternative embodiment, the grating section having the first and second grating sections and the phase-shift section may be disposed below the active region (i.e., sandwiched between the active region and the substrate), instead of above the active region. In another embodiment, DBR grating sections are disposed both above and below the active region, i.e. there are four separate grating sections.

In the preferred embodiments a described above, the gratingless phase-shift section of the present invention achieves a $\lambda/4$ (i.e., $\lambda/2$) phase shift at kg. In alternative embodiments, length L2 may be selected in accordance with Eq. (2) to achieve a phase shift less than $\lambda/2$ but still significant enough to break mode degeneracy and achieve single-mode operation. For example, in an embodiment, the gratingless phase-shift section cause a phase shift by some amount $\Phi_{PS}$, where $\Phi_{MIN} \Phi_{PS} \lambda/4$, where $\Phi_{MIN}$ is the minimum phase shift sufficient to provide desirable single-mode operation. For example, in an embodiment, $\Phi_{MIN}$ is about $\pi/4$ (corresponding to $\mu/8$). In another alternative embodiment, $\Phi_{MIN}$ is whatever phase shift is sufficient to achieve a side-mode suppression of at least 30 dB. In other alternative embodiments, side mode suppression thresholds other than 30 dB may be employed to determine when single-mode operation is sufficiently achieved. In still another alternative embodiment, $\Phi_{MIN}$ is whatever phase shift is sufficient to cause there to be only one mode having the lowest threshold gain, which is significantly lower than the threshold gains of all other modes.

In alternative embodiments, a distributed phase shift section in accordance with the present invention introduces an odd multiple of $\mu/4$ effective optical path length instead of a single $\lambda/4$ optical path length, to achieve a $\pi/2$ phase shift. Thus, the phase shift section may, in general, have a length L2 sufficient to introduce an effective optical path length of $(2n+1)\lambda/4$, where n is an integer $\{0, 1, 2, 3, \dots\}$, which achives a $\pi/2$ phase shift. However, n=0 is employed in the preferred embodiments described above because a longer phase-shift section reduces the available length for reflective optical feedback in the grating sections or, conversely, requires a longer laser cavity in order to accommodate the longer phase-shift section.

In other embodiments, materials, material systems, and layer thicknesses for the layers or elements of laser 100 other than those specified herein may be employed. In alternative embodiments, a laser, structure having first and second DBR grating sections and a gratingless phase shift section in accordance with the present invention may have less than all of the layers and elements shown in the embodiments described above, and may have additional layers or structures not shown. For example, in an alternative embodiment, there are no optical confinement layers 121, 122, and/or no spacer layer 145, and/or no thin protective layer 342 employed during fabrication of grating layer 142 of structure 100. And, for example, in an alternative embodiment, an etch stop layer composed of a quaternary material such as InGaAsP may be disposed in the cladding layer 132, between its boundary with top contact layer 133 and grating stripes 144.

In the present application, a "non-section-112(6) means" for performing a specified function is not intended to be a means under 35 U.S.C. section 112, paragraph 6, and refers to any means that performs the function. Such a non-section-112(6) means is in contrast to a "means for" element under 35 U.S.C. section 112, paragraph 6 (i.e., a "section-112(6) means"), which literally covers only the corresponding structure, material, or acts described in the specification and equivalents thereof.

The present invention, therefore, is well adapted to carry out the objects and attain the ends and advantages mentioned, as well as others inherent therein. While the invention has been depicted and described and is defined by reference to particular preferred embodiments of the invention, such references do not imply a limitation on the invention, and no such limitation is to be inferred. The invention is capable of considerable modification, alteration and equivalents in form and function, as will occur to those ordinarily skilled in the pertinent arts. The depicted and described preferred embodiments of the invention are exemplary only and are not exhaustive of the scope of the invention. Consequently, the invention is intended to be limited only by the spirit and scope of the appended claims (if any), giving full cognizance to equivalents in all respects.

What is claimed is:

1. An edge-emitting laser for generating single-longitudinal mode laser light at a lasing wavelength, the laser comprising:

a semiconductor active region for amplifying, by stimulated emission, light in the laser cavity at the lasing wavelength;

a first grating section adjacent to the active region and having a first reflectance and a first effective index of refraction;

a second grating section adjacent to the active region and having a second reflectance and the first effective index of refraction, the first and second grating sections having a Bragg wavelength substantially equal to the lasing wavelength; and a gratingless phase-shift section disposed adjacent to the active region and between the first and second grating sections and having a second index of refraction greater than the first effective index of refraction, wherein the phase-shift section has a length sufficient to impart a phase shift for light at the lasing wavelength sufficient to achieve single-longitudinal mode operation.

2. The laser of claim 1, wherein the first and second grating sections are distributed Bragg reflectors.

3. The laser of claim 1, wherein the fist and second grating sections have a grating period selected so that the Bragg wavelength of the grating sections is substantially equal to the lasing wavelength.

4. The laser of claim 1, wherein the phase-shift section is a distributed phase-shift section.

5. The laser of claim 1, wherein the phase-shift section imparts a phase shift of about $\pi/2$ for light at the lasing wavelength.

6. The laser of claim 1, wherein the phase-shift section imparts a phase shift of at least about $\pi/4$ for light at the lasing wavelength.

7. The laser of claim 1, wherein the phase-shift section imparts a phase shift for light at the lasing wavelength sufficient to achieve single-longitudinal mode operation having at least 30 db side-mode suppression.

8. The laser of claim 1, further comprising a support substrate, wherein the active region is disposed between the support substrate and the first and second grating sections and the phase-shift section.

9. The laser of claim 1, wherein the first and second grating sections each comprise a plurality of grating stripes composed of a grating stripe material consisting of InGaAsP surrounded by a cladding material consisting of InGaAsP.

10. The laser of claim 1, wherein the first and second grating sections each comprise a plurality of grating stripes composed of a grating stripe material surrounded by a cladding material having a smaller index of refraction than that of the grating stripe material, wherein the phase-shift section comprises a gratingless section of grating stripe material surrounded by the cladding material.

11. The laser of claim 11, wherein the grating stripe material consists of InGaAsP and the cladding material consists of InP.

12. The laser of claim 1, wherein the lasing wavelength is about 1.31 µm.

13. The laser of claim 1, wherein the lasing wavelength is about 1.55 µm.

14. The laser of claim 1, wherein each of the lengths of the first grating section, the second grating section, and the phase-shift section is no more than about three times the length of the other two of said sections.

15. The laser of claim 1, further comprising a first anti-reflectance (AR) coating disposed on a facet adjacent to and perpendicular to the first grating section and a second anti-reflectance (AR) coating disposed on a facet adjacent to and perpendicular to the second grating section.

16. The laser of claim 1, wherein the length of the second grating section is greater than the length of the first grating section whereby said second reflectance is greater than said first reflectance.

17. The laser of claim 1, wherein the active region comprises a plurality of quantum well structures.

18. The laser of claim 1, wherein the active region comprises a semiconductor material adapted to amplify, by stimulated emission, light in the laser cavity at the lasing wavelength at around the lasing wavelength.

19. The laser of claim 1, wherein the first and second grating sections and the phase-shift section are parallel to the active region.

20. An edge-emitting laser for generating single-longitudinal mode laser light at a lasing wavelength, the laser comprising:

a semiconductor active region for amplifying, by stimulated emission, light in the laser cavity at the lasing wavelength;

a first grating section adjacent to the active region and having a first reflectance and a first effective index of refraction;

a second grating section adjacent to the active region and having a second reflectance and the first effective index of refraction, the first and second grating sections having a Bragg wavelength substantially equal to the lasing wavelength; and a gratingless, distributed phase-shift section disposed adjacent to the active region and between the first and second grating sections and having a second index of refraction greater than the first effective index of refraction.

21. The laser of claim 20, wherein the phase-shift section has a length sufficient to impart a phase shift for light at the lasing wavelength of at least $\pi/4$.

22. The laser of claim 20, wherein the phase-shift section has a length sufficient to impart a phase shift for light at the lasing wavelength sufficient to achieve single-longitudinal mode operation.

23. The laser of claim 20, wherein the first and second grating sections each comprise a plurality of grating stripes composed of a grating stripe material surrounded by a cladding material having a smaller index of refraction than that of the grating stripe material, wherein the phase-shift section comprises a gratingless section of grating stripe material surrounded by the cladding material.

24. The laser of claim 20, wherein the length of the second grating section is greater than the length of the first grating section whereby said second reflectance is greater than said first reflectance.

* * * * *